(12) United States Patent
Belyansky et al.

(10) Patent No.: US 6,869,860 B2
(45) Date of Patent: Mar. 22, 2005

(54) FILLING HIGH ASPECT RATIO ISOLATION STRUCTURES WITH POLYSILAZANE BASED MATERIAL

(75) Inventors: Michael P. Belyansky, Bethel, CT (US); Rama Divakaruni, Ossining, NY (US); Laertis Economikos, Wappingers Falls, NY (US); Rajarao Jammy, Hopewell Junction, NY (US); Kenneth T. Settlemeyer, Jr., Poughquag, NY (US); Padraic C. Shafer, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/250,092

(22) Filed: Jun. 3, 2003

(65) Prior Publication Data

US 2004/0248374 A1 Dec. 9, 2004

(51) Int. Cl.$^7$ ................................................ H01L 21/76
(52) U.S. Cl. ....................................... 438/435; 438/424
(58) Field of Search ......................... 438/212, 218–221, 438/239, 241–244, 353, 359, 424, 427, 430, 435, 437, 443, 691, 692

(56) References Cited

U.S. PATENT DOCUMENTS

| | | | | |
|---|---|---|---|---|
| 5,932,283 A | * | 8/1999 | Kaneyama | 427/163.2 |
| 6,146,970 A | * | 11/2000 | Witek et al. | 438/424 |
| 6,194,283 B1 | * | 2/2001 | Gardner et al. | 438/424 |
| 6,235,608 B1 | * | 5/2001 | Lin et al. | 438/424 |
| 6,333,274 B2 | * | 12/2001 | Akatsu et al. | 438/745 |
| 6,489,252 B2 | * | 12/2002 | Goo et al. | 438/758 |
| 6,566,229 B2 | * | 5/2003 | Hong et al. | 438/435 |
| 6,593,207 B2 | * | 7/2003 | Hong et al. | 438/424 |
| 6,596,607 B2 | * | 7/2003 | Ahn | 438/424 |
| 6,693,050 B1 | * | 2/2004 | Cui et al. | 438/782 |
| 6,737,333 B2 | * | 5/2004 | Chen et al. | 438/424 |
| 6,740,955 B1 | * | 5/2004 | Hong et al. | 257/506 |
| 6,762,126 B2 | * | 7/2004 | Cho et al. | 438/694 |
| 2002/0072246 A1 | | 6/2002 | Goo et al. | |
| 2004/0038493 A1 | * | 2/2004 | Shih et al. | 438/424 |
| 2004/0192009 A1 | * | 9/2004 | Belyansky et al. | 438/424 |

FOREIGN PATENT DOCUMENTS

GB          2361937 A          7/2001

OTHER PUBLICATIONS

A Highly Manufacturable Low–Thermal Budget, Void and Seam Free Pre–Metal–Dielectric Process Using New SOG for beyond 60nm DRAM and Other Devices, Juseon Goo, et al. 0–7803–7502–X/01, 2001 IEEE.

Void–Free and Low–Stress Shallow Trench Isolation Technology using P–SOG for sub–0.1 um Device, 2002 IEEE Symposium on VLSI Technology Digest of Technical Papers, pp 132, 133 0–7803–7312–X/02.

* cited by examiner

Primary Examiner—John F. Niebling
Assistant Examiner—Stanetta Isaac
(74) Attorney, Agent, or Firm—Eric W. Petraske; Margaret A. Pepper (57) ABSTRACT

Isolation trenches and capacitor trenches containing vertical FETs (or any prior levels p-n junctions or dissimilar material interfaces) having an aspect ratio up to 60 are filled with a process comprising: applying a spin-on material based on silazane and having a low molecular weight; pre-baking the applied material in an oxygen ambient at a temperature below about 450 deg C.; converting the stress in the material by heating at an intermediate temperature between 450 deg C. and 800 deg C. in an H2O ambient; and heating again at an elevated temperature in an O2 ambient, resulting in a material that is stable up to 1000 deg C., has a compressive stress that may be tuned by variation of the process parameters, has an etch rate comparable to oxide dielectric formed by HDP techniques, and is durable enough to withstand CMP polishing.

10 Claims, 6 Drawing Sheets

FILLING HIGH ASPECT RATIO ISOLATION STRUCTURES WITH POLYSILAZANE BASED MATERIAL

BACKGROUND OF INVENTION

The field of the invention is that of filling high aspect ratio trenches in integrated circuit processing.

As ground rule dimensions shrink in integrated circuits, the problem of filling high aspect ratio trenches increases, in particular for isolation trenches used in the shallow trench isolation process, STI, that is commonly used in advanced processing.

The industry-standard filling material and process has been silicon oxide, SiO2, deposited with the high density plasma, HDP, technique. This method has been widely adopted because it produces a high quality material that has good filling properties. Designers of integrated circuits have adapted their structural and material specifications to this process and material.

Since silicon is piezo-electric, the properties of field effect transistors, FETs, are affected by the stress on the transistor body.

In the STI process, the isolation trench material is in contact with the edges of the transistor body, so that changes in stress in that material affect the properties of the body, in particular the threshold voltage and the transistor drive.

As an additional consideration, the lengthy processes required to fabricate an integrated circuit are currently highly integrated; i.e. a change in a single process step can affect the result of steps performed before and after it, sometimes affecting steps that are not immediately before or after, but separated in time by several other steps.

It is therefore a multi-dimensional or multi-factor decision to change a process step. It is not enough that the new step produce a tougher, or thinner, or lower-density film, or take less time to put down. It is also required that the new step not produce disadvantages in other aspects of the process that outweigh the benefits.

In the particular case of isolation trench fill, the problem addressed by the present invention is that of filling high aspect ratio isolation trenches without introducing voids.

While HDP process typically shows a non-conformal deposition profile, it is known to produce voids and/or seams when filling high aspect ratio trenches, as do most of conformal deposition processes. The reason is that the material deposits on the upper surfaces of a deep trench or aperture and eventually pinches off, blocking the opening at the top and subsequently preventing material from getting down to the bottom of the trench. Present HDP techniques have a major problem in filling structures with aspect ratio greater than 4.

In order to remove blocking material from the top of isolation structures a complicated sequence of filling isolation trenches used by a major integrated circuit manufacturer involving deposition and etch cycles: First Deposit; First Wet Etch (to remove blocking material on the top); Second Deposit; Second Wet Etch; Third Deposit; and Etc (overfilling the aperture). Further processing may include a Dry etch thickness reduction followed by Chemical-Mechanical Polish (CMP)

This is obviously an expensive process and it would be highly desirable to have a process with fewer steps and lower cost that produced an equivalent filling material.

As described above, an essential consideration of the decision to introduce a new process is whether its advantages, e.g. lower cost, outweigh its disadvantages. In particular, whether the density, etch resistance, and stress of the process are close enough to the properties of HDP oxide that a major revision of the process is not required.

Another very important issue is the temperature budget of the isolation structure if at least one p-n junction or other structure having a thermal budget (meaning a limit on the time and temperature to which the element may be exposed) associated therewith has been formed on a chip before the isolation structure is built. This is also true for any dissimilar materials (for example a Si/SiGe interface to create strained silicon, etc). If any of such junction or dissimilar material interface (referred to collectively as circuit elements having a thermal budget) is built before the isolation structure then a change (increase) in isolation temperature budget leads to dopant inter-diffusion (or material inter-diffusion) and causes device degradation. In general, any change in material diffusion and dopant concentration profiles will most probably degrade device performance.

A case in point is a vertical transistor DRAM/eDRAM, where two adjacent capacitors can cross-talk to each other if the out-diffusion of As lasted long enough to travel between two buried strap contacts. Since deep trench capacitors are build before the isolation structures, the temperature budget of isolation processing should not exceed of that of the deep trench capacitor to prevent excessive As out-diffusion.

It is known that spin on materials, referred to as spin-on glass (SOG) or spin-or dielectric (SOD) have excellent filling properties.

It is also known that the other properties of these materials are much inferior to those of HDP oxide (also referred to as HDP).

For example, spin-on glass has tensile stress, a high wet etch rate and is not thermally stable.

Some work has been done with a material referred to as poly-silazane, which has good filling properties. The material has a structural formula of [SiNR1R2NR3]n, where R1, R2 and R3 are all hydrogen in the case of inorganic poly-silazane and are alkyl, aryl, or alkoxyl organic radicals in organic poly-silazane. For convenience, the term poly-silazane will be shortened to silazane.

The material has a molecular weight of between 1,000 and 10,000. It is applied as dissolved in a solvent for the spin-on step. The solvent is driven off in a pre-bake step at relatively low temperature (less than about 350 deg C.) and the material is cured by heating in various ambients.

Samsung has done work on various applications of silazane, including an interlevel dielectric film below the first level of metal (UK patent GB2361937), in which the recommended film is annealed in water vapor at a temperature of between 900 deg C. and 1000 deg C. This reference uses a two-step process of a pre-bake and high temperature steam (having water vapor) bake, without consideration of the resulting stress, or of CMP. The only planarization was that provided by the spin-on process.

Another reference by a Samsung group, "Void-Free and Low Stress Shallow Trench Isolation Technology using P-SOG for sub-0.1 um Device", 2002, IEEE Symposium on VLSI Technology Digest of Technical Papers, pp 132, 133 (0-7803-7312-X/02) IEEE 2002, discloses a silazane process using an anneal in an oxidizing ambient at 700 deg C. (preceded by a wet etch recess) and followed by a HDP oxide cap and CMP of the HDP oxide.

Other references by a Samsung group, Pub. No. US 2002/0072246 A1, Jun. 13, 2002 and "A Highly Manufacturable, Low Thermal Budget, Void and Seam Free Pre-Metals Dielectric Process Using New SOG for beyond 60 nm DRAM and Other Devices", 0-7803-7052-X/01, 2001 IEEE disclose a three step process for forming the interlevel dielectric below the first level of metal, in which a first bake is performed at a temperature between 350 deg C. and 500 deg C. An annealing process is performed in a broad temperature range of between 600 and 1200 deg C., preferably in an oxidizing atmosphere.

These references teach the use of a CMP process between the baking step (less than 500 deg C.) and the annealing step.

The foregoing references illustrate that semiconductor process integration is highly application specific. It is not enough that the process forms a film that insulates if the stress is not what the transistor was designed for; or if the film etches too fast and too much of it is removed in an etch step that is primarily designed to remove another portion of the structure; or if the film is damaged during a subsequent high temperature step that is critical and cannot be changed. It is also important that the isolation dielectric anneals do not shift any pre-existing p-n structures and interfaces on a chip.

The art has continued to search for an isolation trench fill process that performs the basic job of isolating satisfactorily and also has a stress and etch resistance that is close to that of industry standard HDP oxide.

SUMMARY OF INVENTION

The invention relates to a method of filling isolation trenches in silicon integrated circuits, which have at least one p-n junction or dissimilar material interface prior to isolation structure buildup.

An aspect of the invention is the production of void-free thermally stable material having compressive stress within the temperature budget limitation of prior levels junction(s).

An aspect of the invention is a stress conversion step that converts the stress in the material from tensile to compressive.

Another aspect of the invention is a stress conversion step followed by an anneal in a dry ambient.

Another aspect of the invention is a first heating step in a steam ambient followed by the anneal in a dry ambient.

Another aspect of the invention is the ability to relate total allowed device temperature budget and the annealing step to tune the stress and wet etch rate of the final material.

DETAILED DESCRIPTION

Figure 1A:
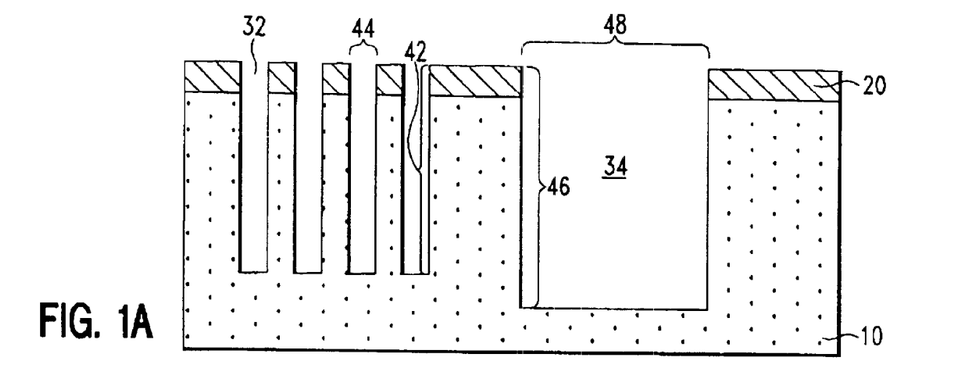
FIGS. 1A–1C illustrate a portion of a substrate in the course of the invention.
Figure 1B:
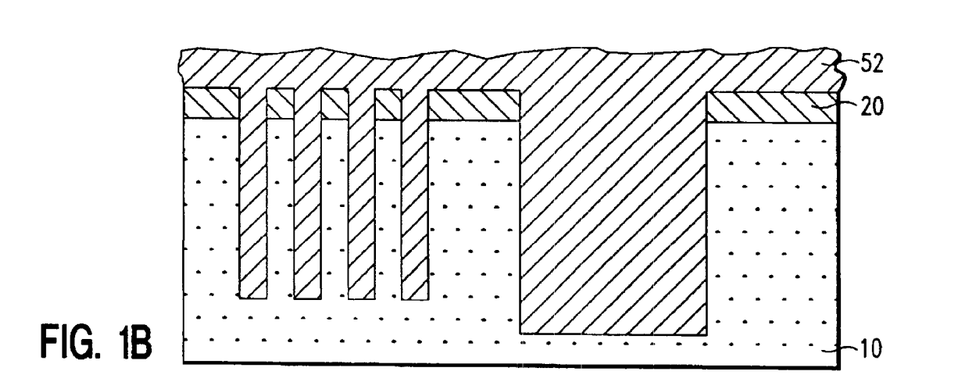
Figure 1C:
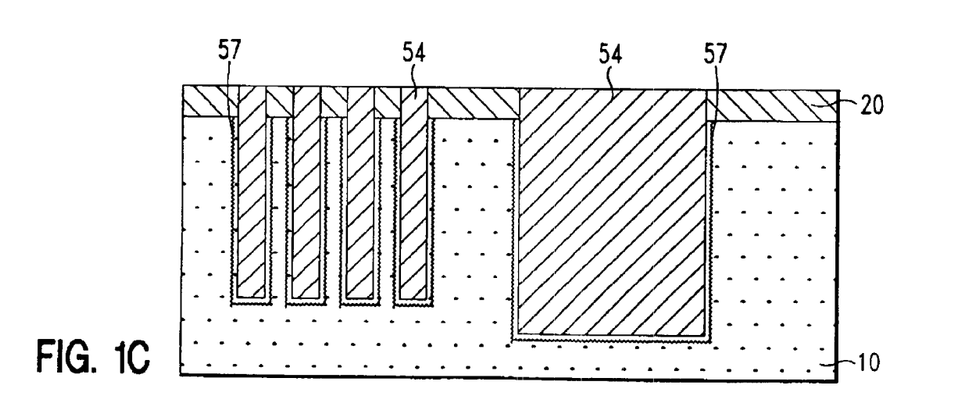

The basic sequence in an SOD application is illustrated in FIG. 1, in which a silicon substrate 10 having a pad nitride/oxide 20 has a set of apertures that have been etched in it by any convenient process, e.g. a reactive ion etch. Two sizes of apertures are shown to illustrate that actual wafers will have a variety of values for the spacing between apertures and the width of the apertures, as well as different depths. The variation may result from fluctuations in a single etching process that may depend, for example, on the pattern density or it may result from the simultaneous filling of apertures formed in two different processes.

On the right of FIG. 1A, aperture 34 has a width 48 and a depth 46, giving an aspect ratio of 46/48. Apertures 32 have a width 44 and a depth 42, giving an aspect ratio 42/44. It is evident that the aspect ratio of the apertures 32 will be higher than that of aperture 34, so that the process in question will need to accommodate a range of aspect ratios.

In the course of the process, a trench dielectric material filling substance, referred to as a spin-on dielectric (SOD) or spin-on glass (SOG) will be applied to the wafer, which is rotated to spread the material quite uniformly over the surface. The material, which has a suitably low viscosity, will penetrate into the various apertures and overfill, with a top surface 52 above the top surface of pad 20. The result is shown in FIG. 1B.

The wafer is then planarized by CMP or by an etchback step to remove the excess overfill material, as shown in FIG. 1C. FIG. 1C also shows an extra thickness of oxide 57 formed along the sides of the apertures by annealing the material in an oxidizing ambient. A conventional step of annealing in an ambient containing water vapor converts the Nitrogen and Hydrogen in the silazane to ammonia and molecular Hydrogen that escapes from the material, leaving a residue that is largely silicon oxide. The presence of oxygen in the ambient assists in converting Si—N bonds to Si—O bonds. The properties of the final material will depend on the degree to which this conversion has been accomplished.

Figure 2A:
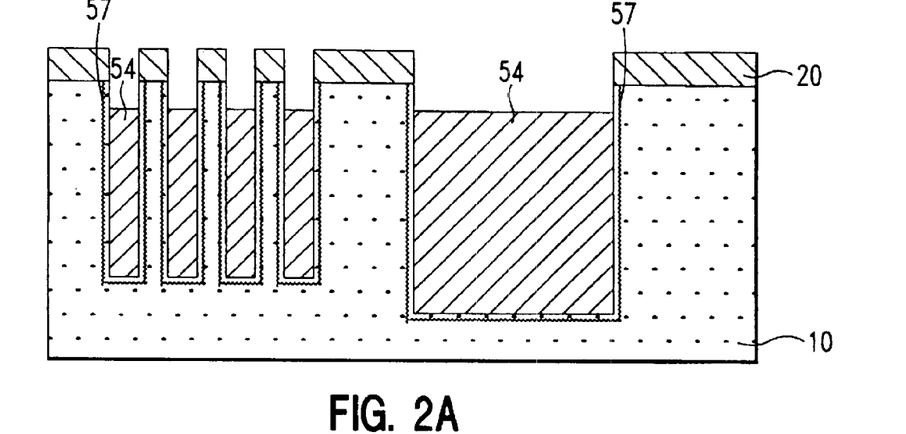
FIGS. 2A, 2B illustrate an optional step of applying an HDP cap layer.
Figure 2B:
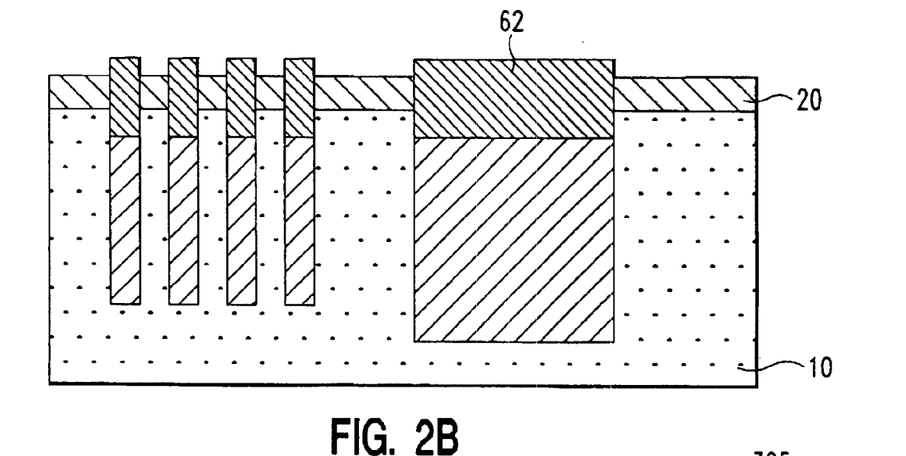

FIGS. 2A and 2B illustrate an optional aspect of the invention, in which the silazane fill 54 is recessed by any conventional etch and a cap layer 62 of HDP is deposited by standard techniques and planarized with CMP.

Those skilled in the art will appreciate that the process will be more consistent and the results better if the stress of the silazane layer 54 is close to that of HDP layer 62.

Figure 3A:
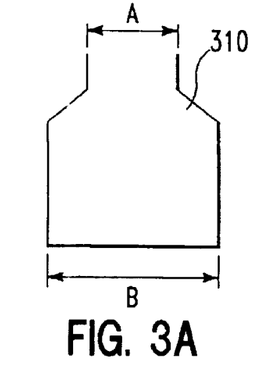
FIG. 3 illustrates the filling of an aperture with a reentrant profile.

Spin-on materials have the well known property that they fill various aperture profiles that a process such as chemical vapor deposition cannot fill. Referring now to FIG. 3, there is illustrated an aperture 310 having a reentrant profile, meaning that there is at least one level where the transverse dimension B is less than the corresponding transverse dimension A at or near the top of the aperture. This occurs by design in the case of a trench capacitor or by accident when a divot has been formed on a wall that is intended to be smooth.

Figure 3B:
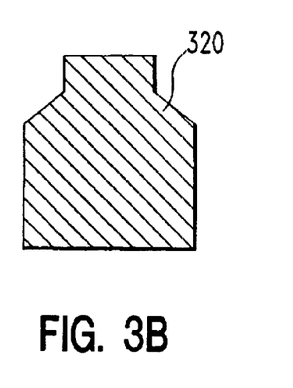
Figure 3C:
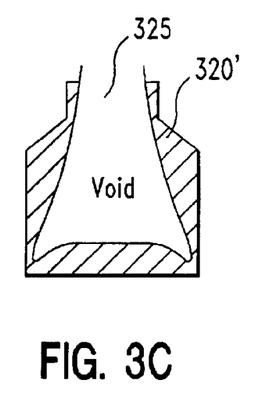

FIG. 3C illustrates the result of a CVD application, with a void 325 that has been formed in the body of material 320'. In contrast, FIG. 3B shows the result of a spin-on application that fills the aperture uniformly.

It is well known in the art that the industry standard material for isolation trenches, referred to as shallow trench isolation, or STI, is High Density Plasma-assisted oxide (HDP oxide), which will not fill apertures uniformly when the aspect ratio is more than about 4 (assuming a vertical trench sidewall profile).

In modern processing, there is very strong pressure to increase the density of features on a chip, so that the aspect ratio is constantly increasing. Process engineers are now working on filling trenches with aspect ratios in the range of about 10 and planning on filling trenches with much higher aspect ratios. Various complex and expensive schemes are in use to fill high aspect ratio trenches that involve depositing a portion of the total material, cleaning out the upper portion of the aperture so that new material is not blocked, then filling a second portion, etc.

Process engineers go to this effort in spite of the much better filling properties of spin-on materials because no spin-on material is currently acceptable. In the case of isolation trenches, it is not enough that the filled trench insulate—i.e. not conduct current. Process integration requires that the steps in the process and the properties of the resulting material must be consistent with the rest of the process and structure.

Since the processes in use at the present time have been developed to be consistent with the properties of HDP oxide, it would require a great deal of effort to alter those current processes. It would be highly advantageous if a spin-on process could be developed that would emulate the material properties of the HDP material.

The inventors have realized that it is possible to tune the stress, composition and wet etch resistance of a spin-on material to be similar to those of HDP oxide.

Poly-silazane processed according to the manufacturer's recommendations produces a final material that has properties very different from those of HDP, having poor etch resistance, tensile stress and low density.

According to the invention, the sequence of processing steps is:

Spin-on silazane having a molecular weight in the range of 2000–4000 dissolved in a solvent such as dibutyl ether;

Pre-bake in O2 ambient (400–700 Torr) at a temperature in the range 100–450 deg C. for a period of 20–120 min;

Perform a first anneal in water vapor at a temperature in the range 450–800 deg C. for a period of 20–120 min;

In case temperature budget of prior levels allows: Perform a second anneal in an oxygen ambient without water vapor (400–700 Torr) at a temperature between 800–1200 deg C. for a period of 20–120 min.

Planarize the resulting film by CMP.

For deep STI trenches (aspect ratio >6), an additional step is an extra anneal in water vapor at a temperature in the range 450–800 deg C. for a period of 20–120 min after CMP to ensure that material at the bottom of the trench is oxidized and converted from Si—N bonding to Si—O bonding.

It is an advantageous feature of the invention that the parameters of the final product can be varied by varying the processing parameters. Illustratively, the final material is high quality oxide with low impurity contamination; has a wet etch removal ratio (WERR) at 900 deg C. of less than 1.5; has compressive film stress in the range of 0.1 to 2 Gdyne/cm2; can be planarized by CMP with a standard slurry; is thermally stable at temperatures greater than 1000 deg C.; and has thickness uniformity (<1% sigma) superior to HDP oxide.

Figure 4:
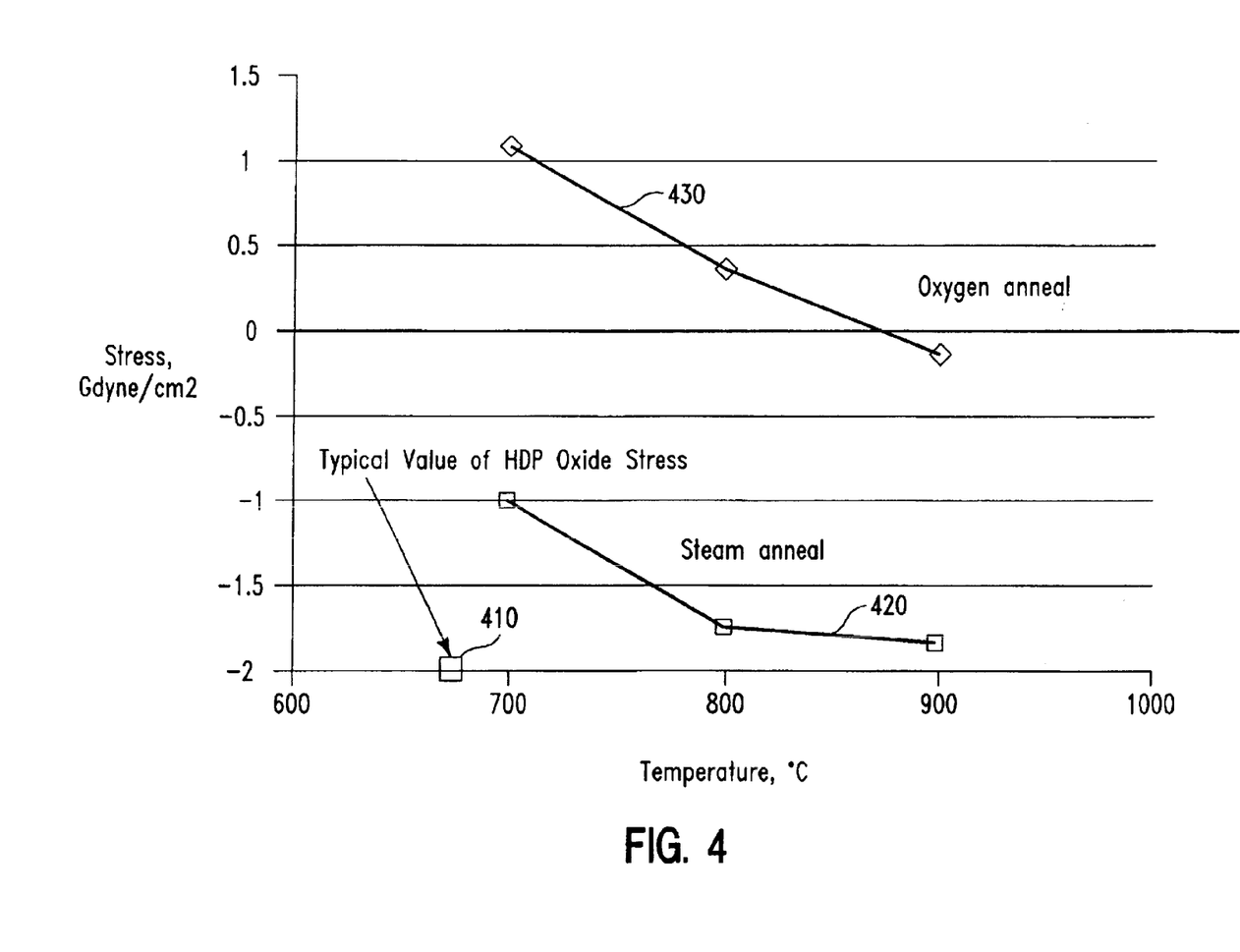
FIG. 4 shows a graph of material stress resulting from different treatments.

Referring now to FIG. 4, the graph shows the material stress in a silazane film annealed with steam and with oxygen ambients. Point 410 shows a typical value for HDP oxide. Curve 420 shows the result of a steam anneal between 700 and 900 deg C. As can be seen, the points at 800 deg C. and 900 deg C. are quite close to HDP, while the result of films annealed in an oxygen ambient (curve 430) have a tensile stress.

Figure 5:
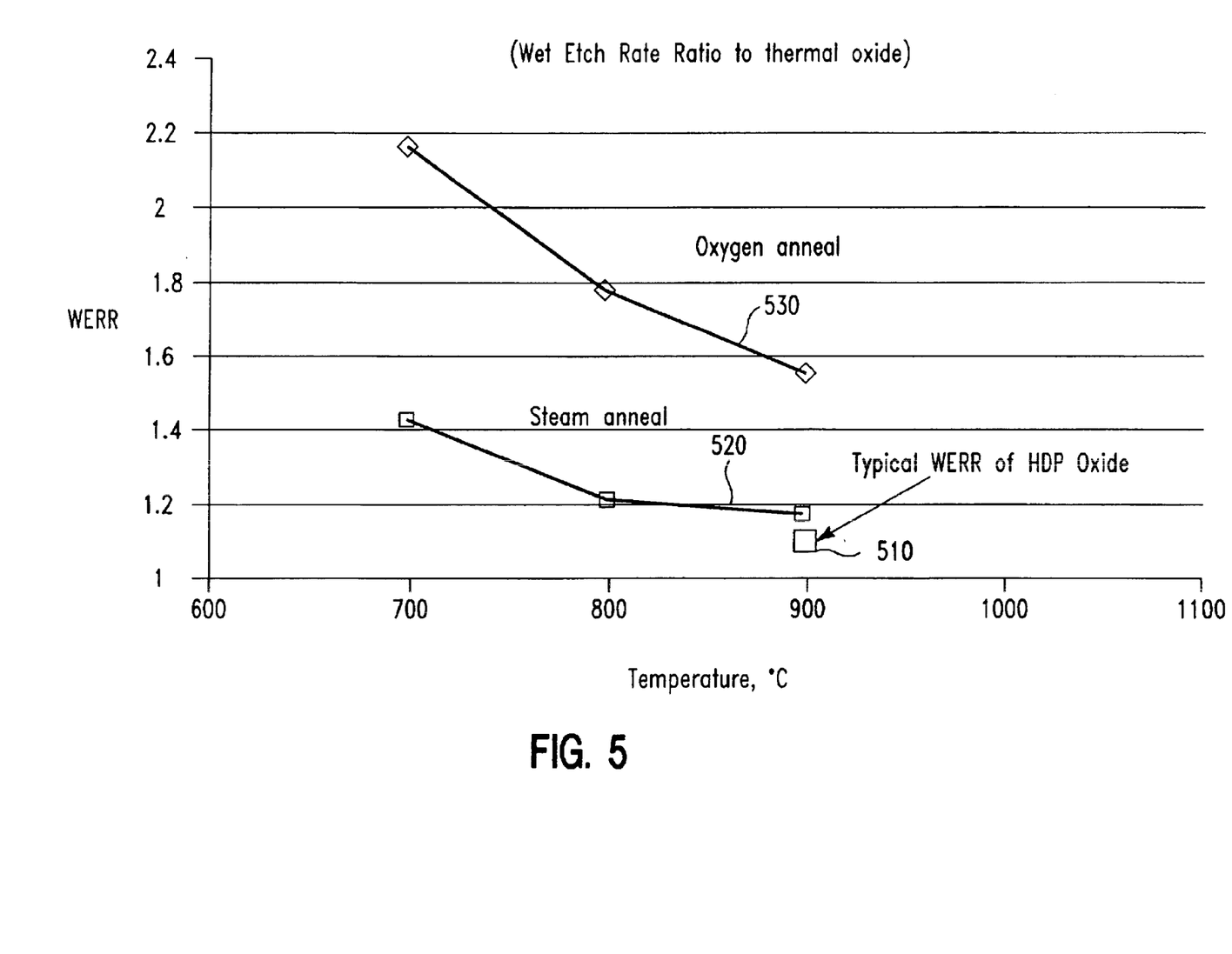
FIG. 5 shows a graph of relative etch rates resulting from different treatments.

FIG. 5 shows corresponding curves for the wet etch rate ratio i.e. the ratio of the etch rate of the film in question to the rate of thermal oxide. The etch material is buffered hydrofluoric acid (BHF). The results, on curve 520, of the steam anneal at 800 and 900 deg C. are again very similar to the results of HDP oxide, point 510, while the results of the oxygen anneal, curve 530, are much higher (having less etch resistance).

Figure 6:
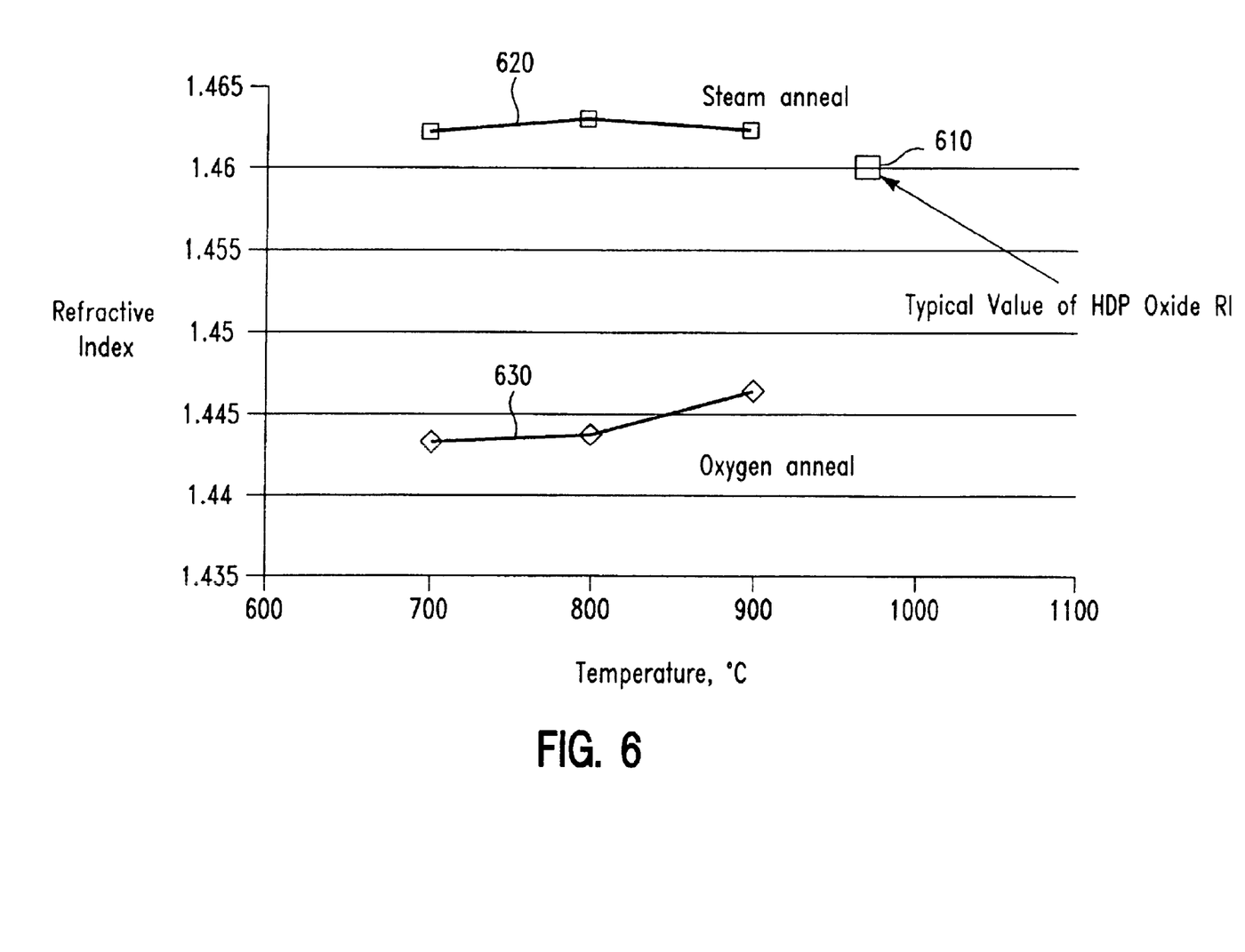
FIG. 6 shows a graph of relative etch rates resulting from different treatments.

FIG. 6 shows corresponding results for the refractive index of the resulting oxide. The refractive index is a measure of material density as well as silicon to oxygen stoichometric ratio.

Again, curve 620 (the steam anneal) is closer to point 610, typical of HDP oxide, while the points on curve 630, the oxygen anneal, are considerably different.

Figure 7:
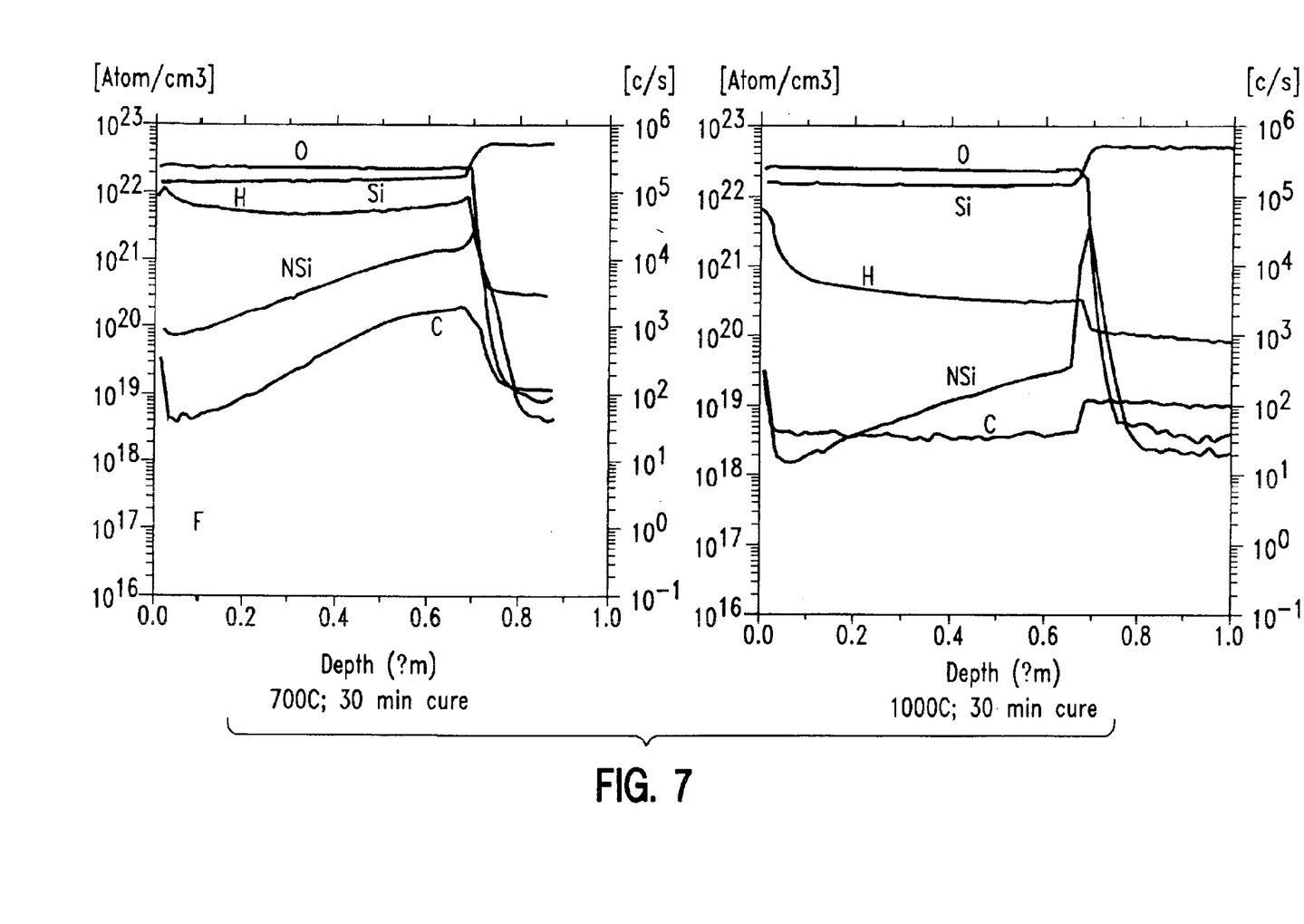
FIG. 7 shows a graph of material composition resulting from different treatments.

FIG. 7 shows the composition of films after anneals at two different temperatures (in steam). The residual concentration of C (curve C), N (curve NSi) and hydrogen (Curve H) are much higher at 700 deg C. than at 1000 deg C.

While very high temperature steam anneal (1000C) produces the film with low impurity levels it is obviously can not be used if prior levels junctions have lower temperature budget restrictions. In the case of a vertical transistor, the STI is often done after the transistor has been formed and for example any prolonged (>10 min) anneal above 900C is prohibited assuming 100 nm vertical DRAM groundrule.

Another well known issue with high temperature steam oxidation of silicon is the formation of defects which decrease activation energy for dopant diffusion (such as B, P, As, etc) and subsequent increase in their diffusion coefficients (so called oxygen enhanced diffusion (OED)). This effect in turn causes even bigger unwanted changes in prior p-n junction profiles.

It has been also found, that steam oxidation above a temperature of 800 deg C. produces excessive oxidation of the silicon in the wafer (either bulk, epitaxial or SOI) that can degrade the parameters of the transistor that will be formed in the active area. Thick oxide film (>300A) grows on an STI sidewall (especially the top corner portion) and creates stress in adjacent active areas as well as increases the number of defects. Defects are easily formed in the top STI corner, after pad SiN strip and subsequent etch and anneal processing steps. The stress in the active areas may vary according to the circuit design. What is beneficially provided by the present invention is that the new trench material does not change the stress that the transistor was designed for.

Once a silazane film is subjected to a first 800C steam anneal it is beneficial to proceed with a second anneal in oxygen at temperatures >800C. Such an anneal further decreases the wet etch rate ratio (to about 1.1 of that of thermal oxide) and keeps film stress compressive within the range of 0.5–2 Gdyne/cm2.

The properties of the final film can be adjusted or tuned by varying the time of the steam anneal and of the oxygen anneal.

While the invention has been described in terms of a single preferred embodiment, those skilled in the art will recognize that the invention can be practiced in various versions within the spirit and scope of the following claims.

What is claimed is:

1. A method of forming an integrated circuit containing a set of thermally sensitive circuit elements having a thermal budget associated therewith and a set of isolation trenches comprising the steps of:

providing a silicon substrate;

forming at least one circuit element having a thermal budget prior to forming the isolation structure;

etching said set of trenches having an aspect ratio of at least four in said silicon substrate;

filling said set of trenches with a spin on trench dielectric material containing silazane;

heating said substrate at a temperature of less than about 450 deg C.;

converting the stress in said trench dielectric material from tensile stress to compressive stress by heating in an ambient containing H2O at a temperature between about 450 deg C. and about 900 deg C.;

annealing said substrate by heating in an ambient containing O2 at a temperature above 800 deg C. until Si—N bonds at the bottom of said trench are substantially converted to Si—O bonds, in which the time of the stress conversion step and the time of the anneal step are related such that the thermal budget of the thermally sensitive component is not exceeded;

and said step of stress conversion and said step of annealing are related such that the resulting material has compressive stress in the range of 0.1 to 2 Gdynes/cm2, whereby the operation of transistors adjacent to said set of trenches is not affected and has a WERR of less than about 2; and completing said integrated circuit.

2. A method according to claim 1, in which:
the step of heating said substrate in an ambient containing O2 is performed for an adjustment time such that the WERR of the final material is made substantially equal to a design value.

3. A method according to claim 1, in which:
the trench has an aspect ratio of greater than 6;
the trench dielectric material is planarized by CMP after the step of annealing in an O2 ambient; and
an anneal in an ambient containing water vapor is performed after the step of planarizing for a time sufficient to convert Si—N bonds to Si—O bonds in trench dielectric material at the bottom of the trench.

4. A method according to claim 3, in which:
the step of heating said substrate in an ambient containing O2 is performed for an adjustment time such that the WERR of the final material is made substantially equal to a design value.

5. A method of forming an integrated circuit containing a set of circuit elements and a set of isolation trenches comprising the steps of:

providing a silicon substrate;

etching said set of trenches having an aspect ratio of at least four in said silicon substrate;

filling said set of trenches with a spin on trench dielectric material containing silazane;

heating said substrate at a temperature of less than about 450 deg C.;

converting the stress in said trench dielectric material from tensile stress to compressive stress by heating in an ambient containing H2O at a temperature between about 450 deg C. and about 900 deg C.;

annealing said substrate by heating in an ambient containing O2 at a temperature above 800 deg C. until Si—N bonds at the bottom of said trench are substantially converted to Si—O bonds, in which the time of the stress conversion step and the time of the anneal step are related such that the thermal budget of the thermally sensitive component is not exceeded;

and said step of stress conversion and said step of annealing are related such that the resulting material has compressive stress in the range of 0.1 to 2 Gdynes/cm2, whereby the operation of transistors adjacent to said set of trenches is not affected and has a WERR of less than about 2; and completing said integrated circuit.

6. A method according to claim 5, in which:
the step of heating said substrate in an ambient containing O2 is performed for an adjustment time such that the WERR of the final material is no greater than a design value.

7. A method according to claim 6, in which:
the step of heating said substrate in an ambient containing O2 is performed for an adjustment time such that the WERR of the final material is made substantially equal to a design value.

8. A method of forming an integrated circuit containing a set of thermally sensitive vertical transistor DRAM cells having a thermal budget associated therewith and a set of isolation trenches, comprising the steps of:

providing a silicon substrate;

forming at least one vertical transistor DRAM cell having a thermal budget prior to forming the isolation structure;

etching said set of trenches having an aspect ratio of at least four in said silicon substrate;

filling said set of trenches with a spin on trench dielectric material containing silazane;

heating said substrate at a temperature of less than about 450 deg C.;

converting the stress in said trench dielectric material from tensile stress to compressive stress by heating in an ambient containing H2O at a temperature between about 450 deg C. and about 900 deg C.;

annealing said substrate by heating in an ambient containing O2 at a temperature above 800 deg C. until Si—N bonds at the bottom of said trench are substantially converted to Si—O bonds, in which the time of the stress conversion step and the time of the anneal step are related such that the thermal budget of the vertical transistor DRAM cell and said step of stress conversion and said step of annealing are related such that the resulting material has compressive stress in the range of 0.1 to 2 Gdynes/cm2, whereby the operation of transistors adjacent to said set of trenches is not affected and has a WERR of less than about 2; and completing said integrated circuit.

9. A method according to claim 8, in which:
the step of heating said substrate in an ambient containing O2 is performed for an adjustment time such that the WERR of the final material is made substantially equal to a design value.

10. A method according to claim 9, in which:
the step of heating said substrate in an ambient containing O2 is performed for an adjustment time such that the WERR of the final material is made substantially equal to a design value.

* * * * *